(12) United States Patent
Kobayashi et al.

(10) Patent No.: US 6,515,498 B1
(45) Date of Patent: Feb. 4, 2003

(54) APPARATUS AND METHOD FOR PRESSING PROBER

(75) Inventors: Shigetaka Kobayashi, Hyogo (JP); Toshiyuki Eba, Kiyose (JP); Takanori Tahara, Otsu (JP); Kenji Sato, Moriyama (JP); Hiromitsu Wada, Kusatsu (JP)

(73) Assignees: International Business Machines, Armonk, NY (US); Nihon Venture Kogyo Co., Ltd., Saitama (JP); Toray Engineering Co., Ltd., Osaka (JP)

( * ) Notice: Subject to any disclaimer, the term of this patent is extended or adjusted under 35 U.S.C. 154(b) by 0 days.

(21) Appl. No.: 09/479,940

(22) Filed: Jan. 10, 2000

(30) Foreign Application Priority Data

Jan. 11, 1999 (JP) .................................. 11-003846

(51) Int. Cl.[7] .............................................. G01R 31/02
(52) U.S. Cl. ................................... 324/757; 324/158.1
(58) Field of Search ................................ 324/754, 757, 324/72.5, 761, 158.1, 415; 439/482, 188, 219, 169

(56) References Cited

U.S. PATENT DOCUMENTS

| 4,225,819 A | * | 9/1980 | Grau et al. ................. 324/415 |
| 4,383,217 A | * | 5/1983 | Shiell ........................ 324/754 |
| 5,614,820 A | * | 3/1997 | Aoyama et al. ......... 324/158.1 |
| 5,629,630 A | * | 5/1997 | Thompson et al. ......... 324/754 |

FOREIGN PATENT DOCUMENTS

JP          10-246735          9/1998

* cited by examiner

Primary Examiner—Michael Sherry
Assistant Examiner—Minh N. Tang
(74) Attorney, Agent, or Firm—Pillsbury Winthrop LLP

(57) ABSTRACT

An apparatus 10 for pressing a prober according to the present invention, which can press a prober 6 on an electrode-forming portion 4 of an inspection substrate 3 at a sufficient pressure by pivoting four split pressure heads 13 separately by a cylinder 16, and ensure an intimate contact between the prober 6 and the elestrode-forming portion 4 of the inspection substrate 3.

17 Claims, 16 Drawing Sheets

APPARATUS AND METHOD FOR PRESSING PROBER

BACKGROUND OF THE INVENTION

1. Field of the Invention

The present invention relates to an apparatus for pressing a prober plate on an electrode-forming portion of a liquid crystal panel or other circuit boards for inspection.

2. Description of Related Art

Conventionally, in order to inspect a liquid crystal panel, circuit substrate, or the like (hereinafter referred to as inspection substrate), an apparatus for pressing a prober on an electrode-forming portion of the inspection substrate has been used. Generally, in the inspection, such a probe needle as disclosed in the published Japanese Patent Applications No. 7-94559 and No. 9-281139, for example, have been widely used.

However, such probe needle is plated with gold, so that it is quite delicate and expensive. For this reason, as a replacement for a probe needle, a probe plate disclosed in the published Japanese Patent Applications No. 7-240443 and No. 10-123176, which comprises electrodes formed on an insulating substrate, has received widespread attention. Recently, a long length of a probe plate has been developing.

However, as shown in FIG. 9, such a probe plate comprises, as an insulating substrate, a resin film 1 having a plurality of electrodes 2 with fine pitches of 70 μm or less. When the probe is pressed by a pressure head to be brought into intimate contact with a electrode-forming portion 4 of an inspection substrate 3 as shown in FIG. 8, the probe has to be pressed at a relatively high pressure so that the probe can easily be damaged. On the other hand, where the probe is pressed at a low pressure, insufficient contact pressure degrades the reliability of a contact between the probe and the electrodes 5 on the inspection substrate 3, which causes a serious problem in inspection.

SUMMARY OF THE INVENTION

An object of the present invention is to provide an apparatus and method for pressing a prober at a sufficient pressure without injury to the prober, and thereby increasing the reliability of a contact between an inspection substrate and an electrode.

Specifically, in the apparatus and method for pressing a prober according to the present invention, a prober is pressed on an electrode-forming portion of an inspection substrate by a press having a plurality of pressure heads. The term "prober" used in this specification means an electrode that takes an electric current from a predetermined part of a test sample, and it is generally called probe.

Since the apparatus for pressing a prober according to the present invention comprises a plurality of split pressure heads, predetermined portions of the prober, each of which are uniform in size, are pressed by the heads respectively, and an intimate contact between the prober and the inspection substrate is thereby ensured.

BRIEF DESCRIPTION OF THE DRAWINGS

In the accompanying drawings.

DESCRIPTION OF THE PREFERRED EMBODIMENTS

Figure 1:
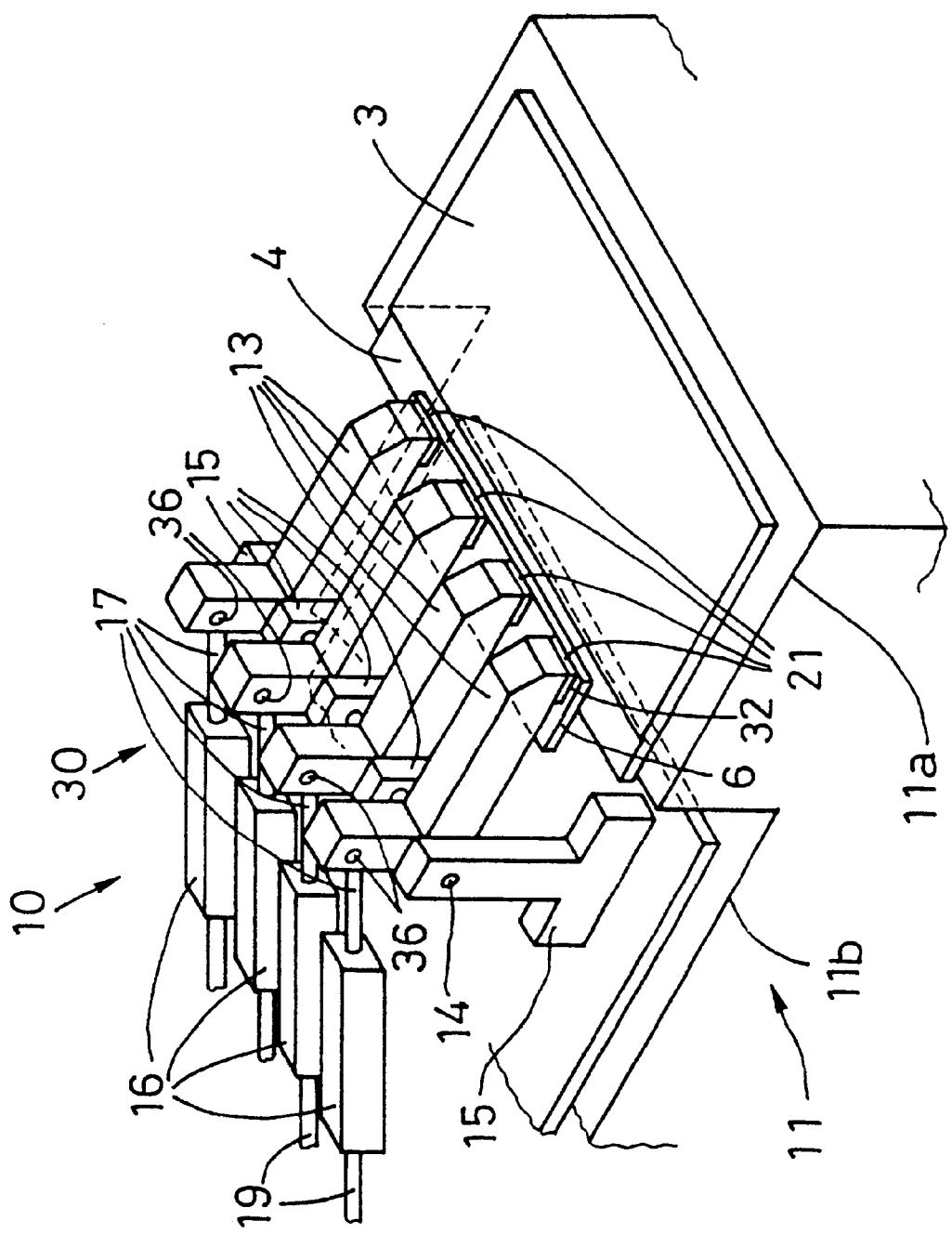
FIG. 1 is a perspective view of an apparatus for pressing a prober according to the present invention.
Figure 2:
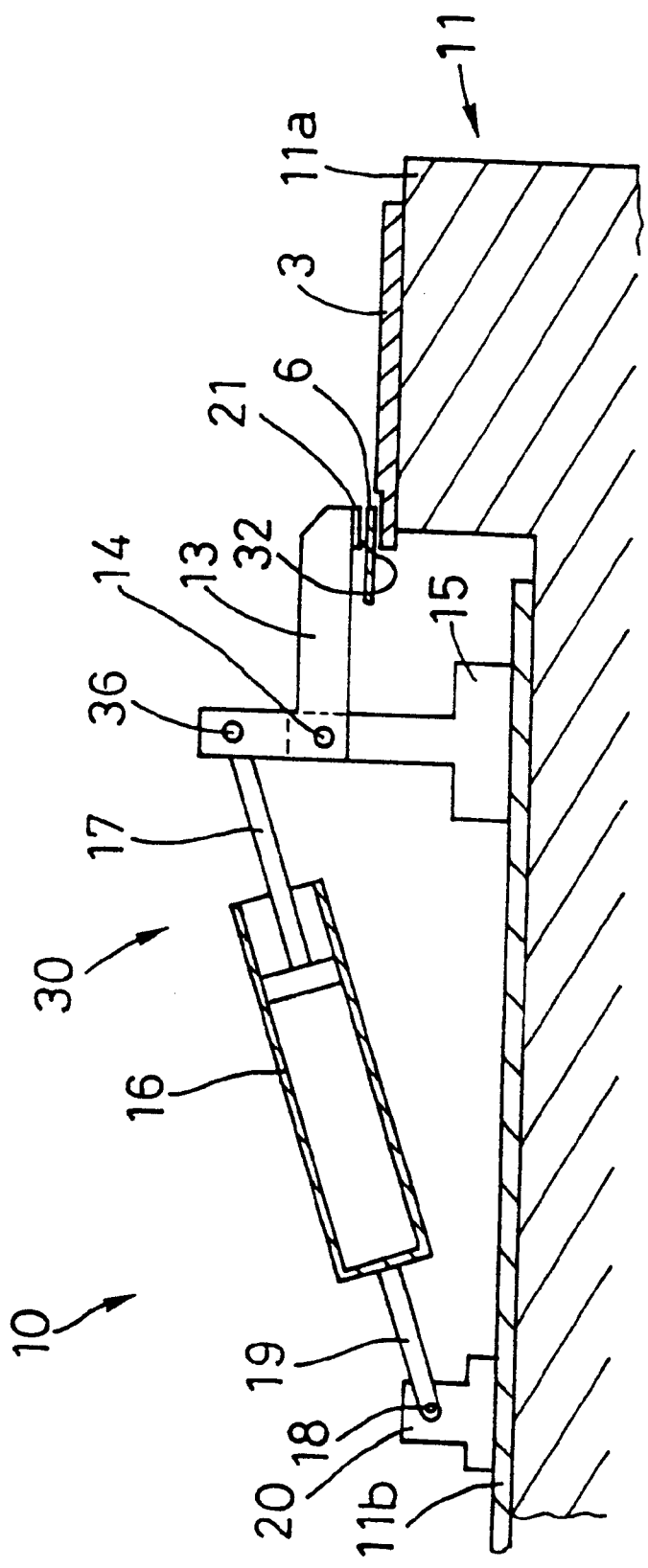
FIG. 2 is a front view of the apparatus shown in FIG. 1.

Embodiments of an apparatus and a method for pressing a prober according to the present invention will hereinafter be described in detail with reference to the attached drawings. In FIGS. 1 and 2, numeral 10 indicates an apparatus for pressing a prober according to the present invention.

The apparatus 10 comprises a press 30 for pressing a prober plate (prober) 6 on an electrode forming portion of an inspection substrate 3. The press 30 has a plurality of split pressure heads 13. Each split pressure head 13 has a pressing surface 32 at its one end for pressing the predetermined position of the prober plate 6.

In the apparatus 10, a plurality of split pressure heads 13 are independently and pivotably secured to pivot pins (pin-coupling portions) 14 so that they can press the prober plate 6 separately. The split pressure heads 13 are pivoted by cylinders (driver) 16, and thereby the pressing surfaces 32 press the predetermined positions of the prober plate 6.

The apparatus 10 comprises a press 30 for pressing the prober plate 6 and a base 11 for placing the inspection substrate 3 on it. Approximately middle portions of the split pressure heads 13 are attached to the base 11 by the pivot pins 14, and when force is applied to points 36 at the one ends of the split pressure heads 13 by the cylinders 16, the pressing surfaces 32 at the other end of the split pressure heads can press the predetermined position of the prober plate 6.

Figure 8:
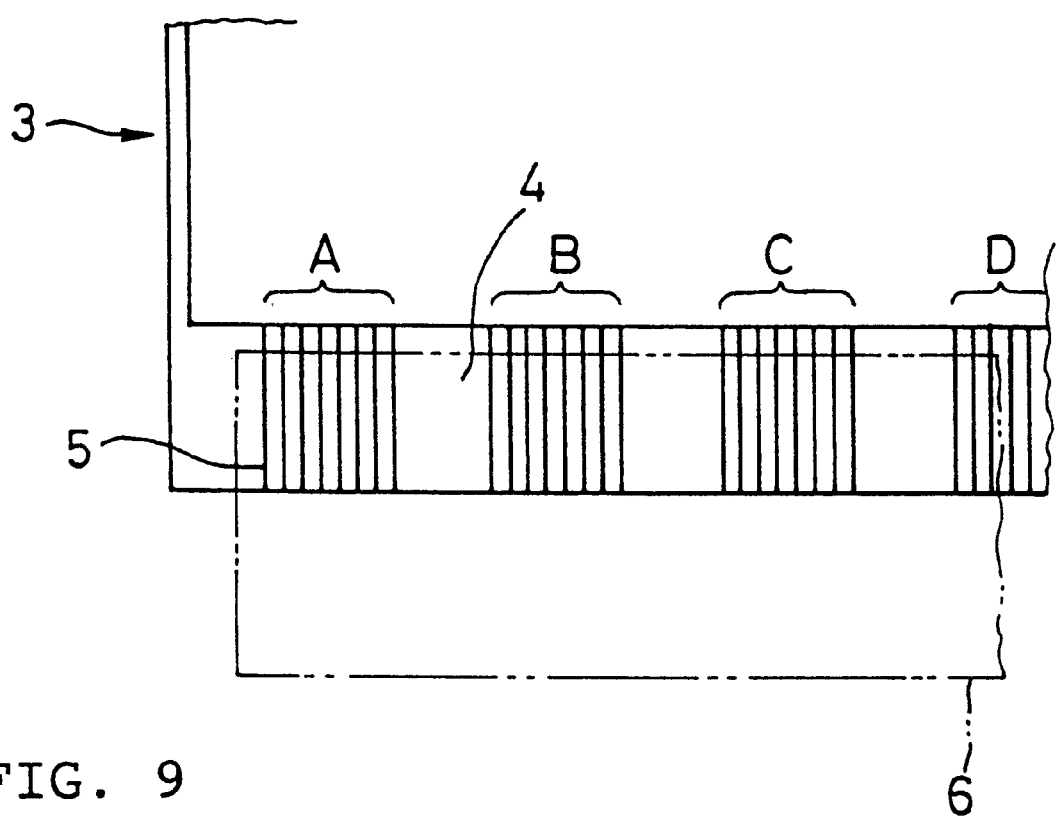
FIG. 8 is a plan view showing an electrode-forming portion of the inspection substrate.

In the accompanying drawings, FIG. 1 shows a front view of an apparatus 10 in which a prober plate is brought into intimate contact with an electrode-forming portion 4 of an inspection substrate 3 such as a liquid crystal panel and the like. The inspection substrate 3 is placed on an inspection table portion 11a of the base 11. As shown in FIG. 8, the electrode-forming portion 4 of the inspection substrate 3 has a plurality of fine electrodes 5 on it.

Figure 9:
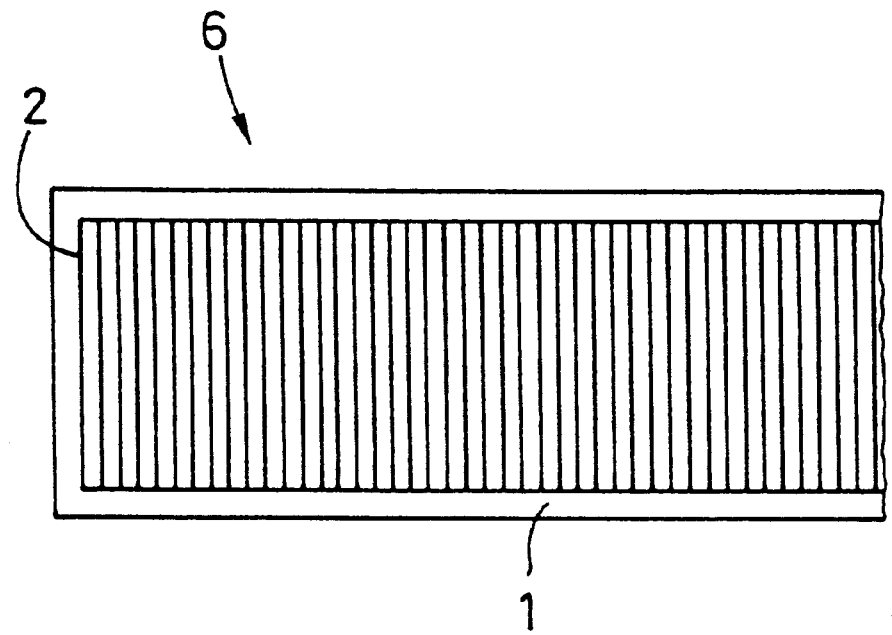
FIG. 9 is a plan view of a probe plate.

On the other hand, as shown in FIG. 9, a plurality of fine electrodes 2 are also formed on a long flexible insulated resin film 1 of the prober plate 6. These electrodes 2 and 5 are high in number. For example, several thousands of electrodes are formed with fine pitches of 70 $\mu$m or less.

The apparatus 10 also comprises four split pressure heads 13, by which a probe plate 6 is pressed on an electrode-forming portion 4 of the inspection substrate 3. These split pressure heads 13 are so placed that they can be brought into intimate contact with portions A, B, C, and D shown in FIG. 8, respectively, and that they can separately pivot about pivot pins 14.

FIG. 2 shows the layout of the parts described above. As shown in FIG. 2, four split pressure heads 13 are pivotably secured to the pivot pins 14 which are unpivotably supported by five pivot bearings 15 fixed to a pivot bearing support portion 11b of the base 11, and a piston rod 17 of a cylinder 16 is connected to each of split pressure heads 13.

While the cylinders 16 are attached to arms 19 so that they can pivot about pivot pins 18, the pivot pins 18 are firmly fixed to pivot bearings 20 which are unpivotably secured to the pivot bearing support portion 11b of the base 11. In accordance with five pivot bearings 15, there are also five pivot bearings 20 provided. The pressure heads 13 each has rubber cushioning material 21 at its one end.

Figure 3:
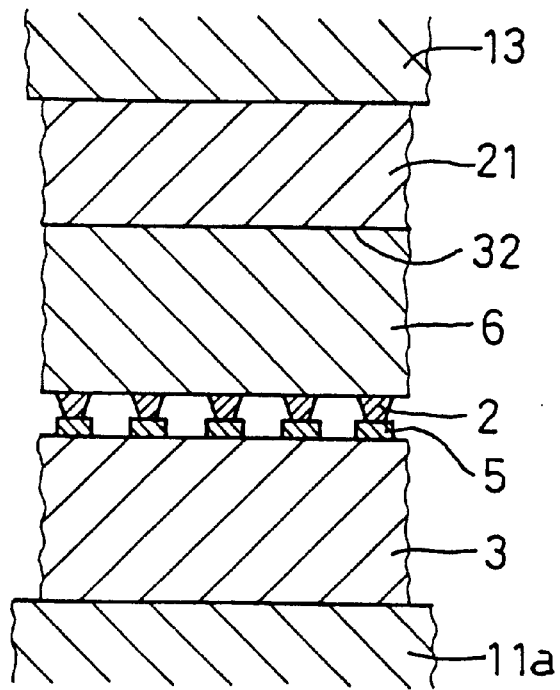
FIG. 3 is a vertical sectional view of the apparatus shown in FIG. 1, in which a prober plate is brought into intimate contact with an inspection substrate by pressure.

In this arrangement, the prober plate 6 positioned on the predetermined portion of the electrode-forming portion 4 is pressed on the electrode-forming portion 4 of the inspection substrate 3 by pushing the piston rod 17 out of the cylinder 16 and moving the split pressure heads 13 downward. FIG. 3 is a vertical section showing a state in which a probe plate is brought into pressure contact with the electrode-forming portion 4 of the inspection substrate 3.

In this apparatus 10, all the split pressure heads 13 can be pivoted at the same time, or only necessary split pressure heads 13 can be selectively pivoted. Alternatively, the split pressure heads 13 can be so pivoted that the pressure to be applied by the heads 13 can be separately adjusted. Thus, the probe plate can be pressed on the electrode-forming portion 4 in various manners.

According to the present invention, the long prober plate 6 is not pressed by only one pressure head, but it is pressed by a plurality of split pressure heads 13. Therefore, even if the long prober plate 6 is easily deformed, sufficient contact pressure and better contact can be achieved between the prober plate 6 and electrodes 5 of the inspection substrate 3 without injury to the prober plate, and the reliability of the contact between the prober plate and the electrodes can be increased.

Figure 4:
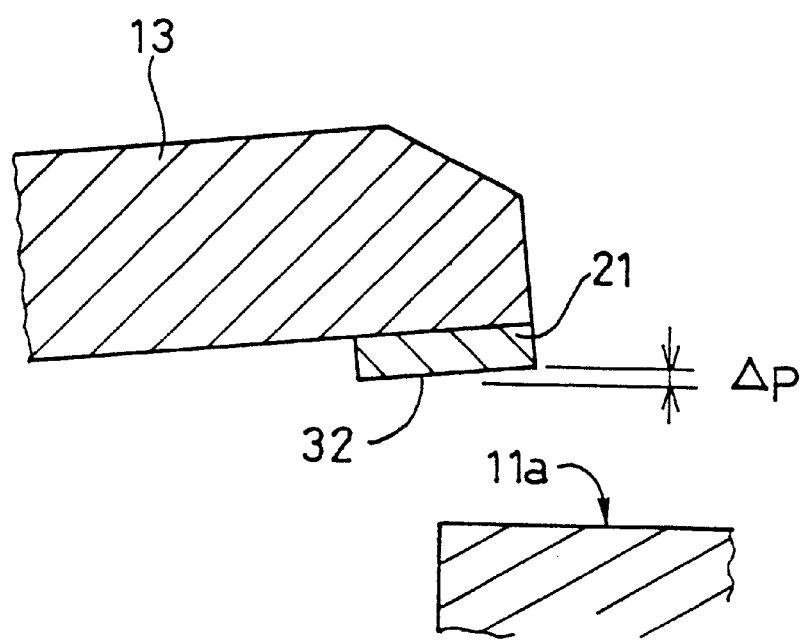
FIG. 4 is a front view showing the difference in parallelism between a pressing surface and an inspection table of the apparatus shown in FIG. 1.
Figure 5:
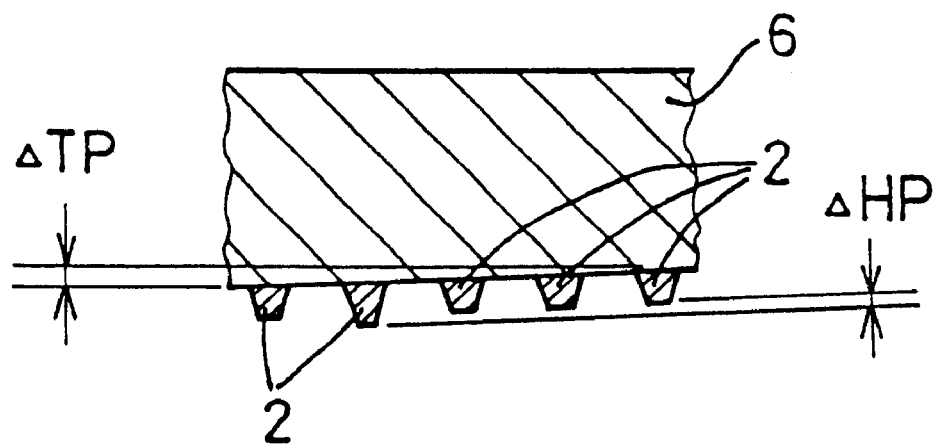
FIG. 5 is a view showing the difference in thickness of an insulating substrate and the difference in height between electrodes of a prober plate.
Figure 6:
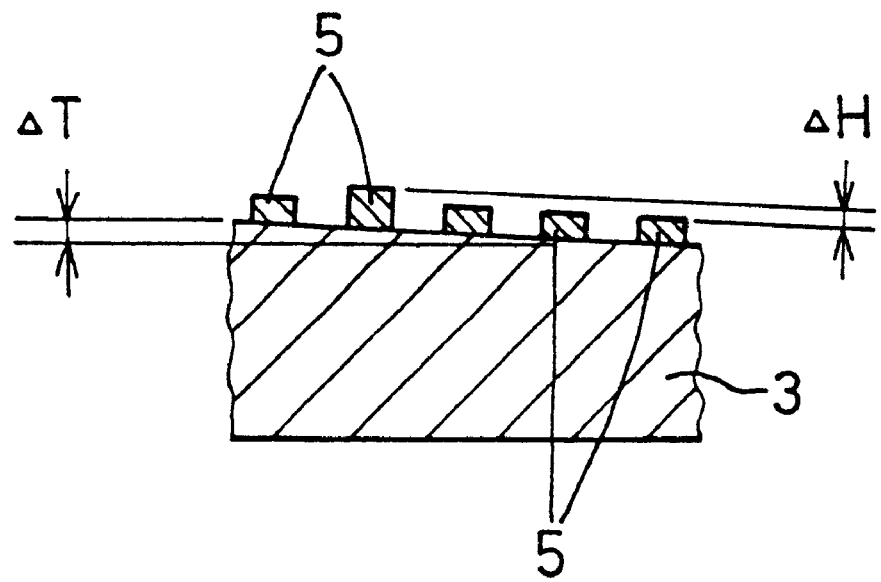
FIG. 6 is a view showing the difference in height between electrodes and the difference in thickness of the inspection substrate.

However, in order to achieve sufficient contact pressure, better contact, and more reliability, a specified requirements must be satisfied. Specifically, a difference $\Delta P$ in parallelism between the inspection table portion 11a of the base 11 and the split pressure heads 13 in FIG. 4; a thickness variation $\Delta TP$ of insulated resinous film 1 of the prober plate 6 in FIG. 5; height variations $\Delta HP$ between electrodes 2 on the prober plate 6 in FIG. 5; height variations $\Delta H$ of the electrodes 5 on the inspection substrate 3 in FIG. 6; and a thickness variation of a glass plate of the inspection substrate 3 in FIG. 6 must be minimized. However, in the present invention, a plurality of split pressure heads 13 makes it possible to minimize the difference and the variations described above.

In the present invention, even a long prober plate 6, on which electrodes are formed with fine pitches of 70 $\mu$m or less, can be brought into an excellent contact with electrodes 5 of the inspection substrate 3 without injury to the prober plate 6. Therefore, the prober plate 6 can be used for various purposes. Furthermore, compared to a conventional probe needle, the cost of inspection can be considerably reduced.

An embodiment of the present invention has thus been described above, but the apparatus and method for pressing a prober according to the present invention can also be materialized in other embodiments.

Figure 7:
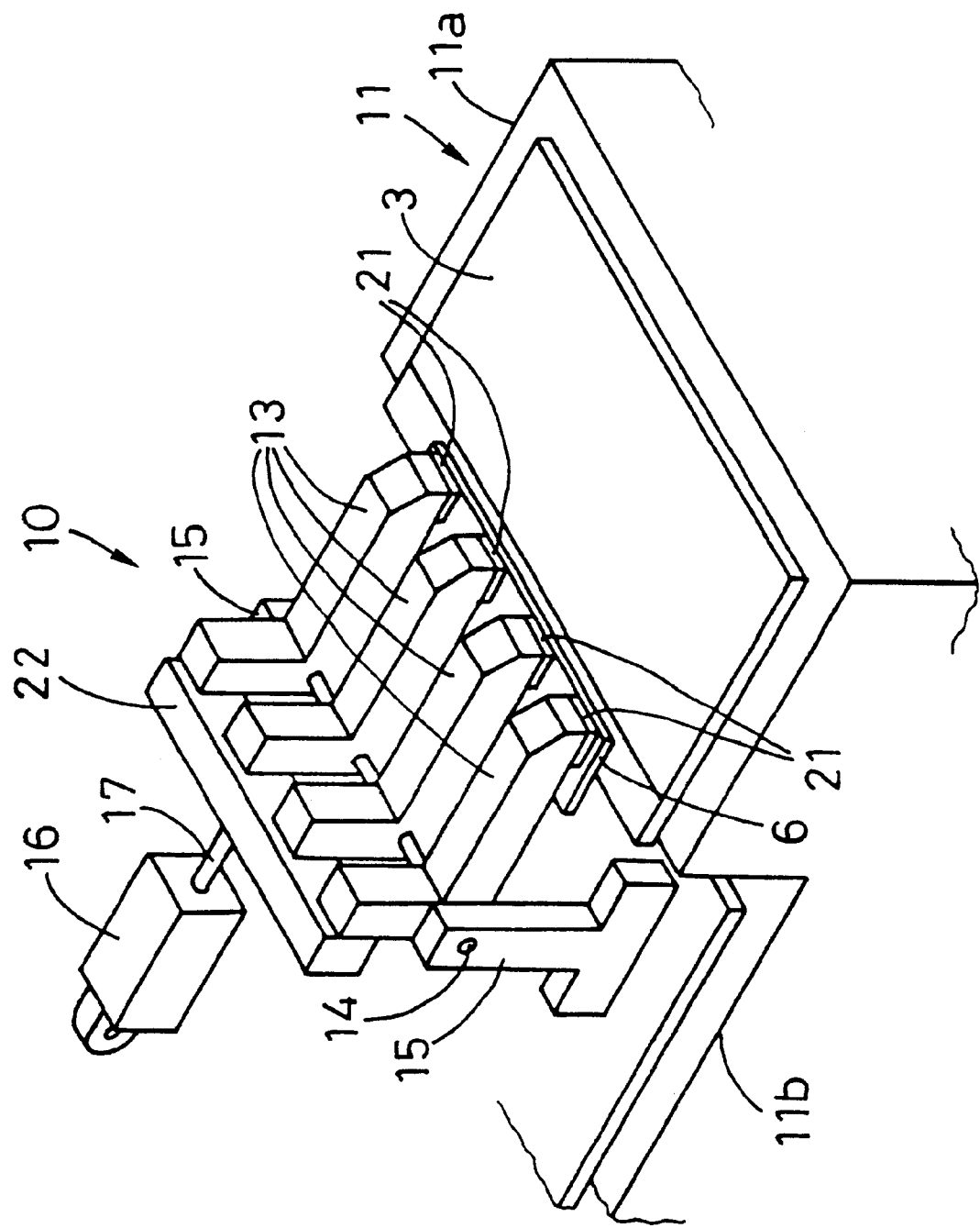
FIG. 7 is a perspective view showing another embodiment of the apparatus for pressing a prober according to the present invention.

For example, the apparatus of the present invention may comprise split pressure heads as shown in FIG. 7. In this embodiment, the apparatus 10 comprises five split pressure heads 13, all of which can be pivoted together by only one cylinder 16. The cylinder 16 of the apparatus 10 is attached in the same way as the one in FIG. 2. The split pressure heads 13 are attached to a bracket 22 secured to a piston rod 17. Therefore, when the piston rod 17 is pushed out of the cylinder, all the split pressure heads 13 are moved downward at the same time. Thus, the prober plate 6 positioned on the predetermined portion of the electrode-forming portion 4 is pressed on the electrode-forming portion 4 of the inspection substrate 3 by pushing the piston rod 17 out of the cylinder 16 and moving all the split pressure heads 13 downward at the same time, or specifically by pivoting the split pressure heads 13 about the pivot pins 14.

Although the prober plate 6 can be brought into intimate contact with the electrode-forming portion 4 by pivoting all the plurality of split pressure heads 13 together in the present invention, it is preferable that the split pressure heads 13 are so attached that they can separately be brought into intimate contact with the prober plate 6. The number of split pressure heads 13 depends on the length of the prober plate 6. Generally, the more electrodes, the longer the prober plates is. A plurality of split pressure heads 13 can be so attached that the spaces between them can be adjusted.

Figure 10:
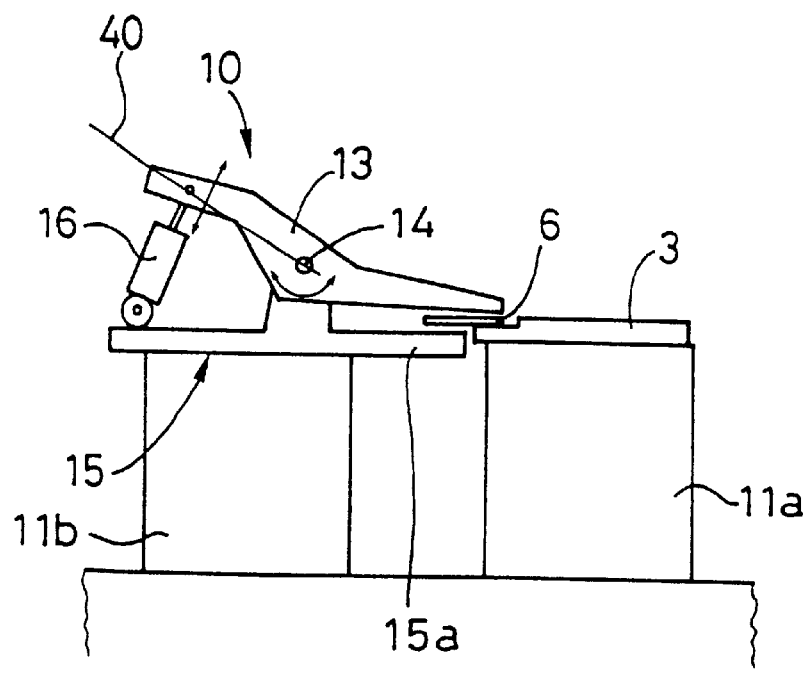
FIG. 10 is a front view of still another embodiment of the apparatus of the present invention, in which an inspection table portion and a pivot bearing support portion are separately provided.

Alternatively, as shown in FIG. 10, the inspection table portion 11a and the pivot bearing support portion 11b can be separately provided. In this case, only a pivot bearing support portion 11b can be a movable table, that is, a XY table or, more preferably, a XY$\theta$ table. The XY$\theta$ table consists of a X table at the bottom, a Y table on the X table, and a $\theta$ table on the Y table. Accordingly, a pivot bearing 15 having a prober bearing portion 15a can be attached to a top table, that is, a $\theta$ table.

Figure 11:
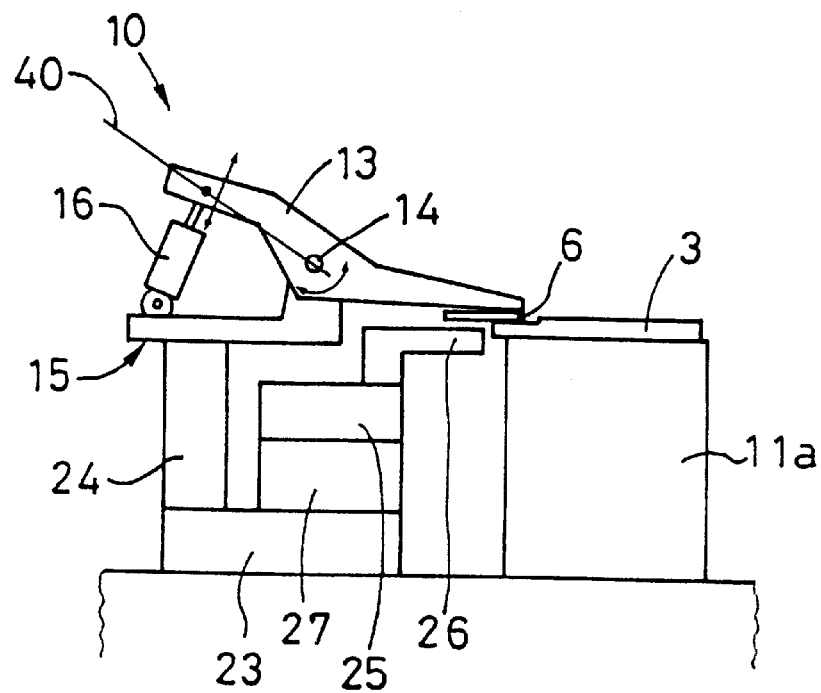
FIG. 11 is a front view of a further embodiment of the apparatus of the present invention, in which an inspection table portion and a pivot bearing support portion are separately provided.

If needs arise, only an inspection table portion 11a, or both an inspection table portion 11a and a pivot bearing support portion 11b can be a XY$\theta$ table. Alternatively, as shown in FIG. 11, a pivot bearing 15 can be attached to a bracket 24 on a X table, and a prober bearing 26 can be attached to a θ table 25. In FIG. 11, numeral 27 is a Y table.

In the apparatus 10 for pressure contacting a prober according to the present invention, the direction of force to be applied to the end of the split pressure heads 13 by a cylinder 16 is not particularly limited. It can be either perpendicular or at a certain angle to a line 40 in which points 36 where force is applied and pivot pins (pin-coupling portions) 14 are included.

Figure 12A:
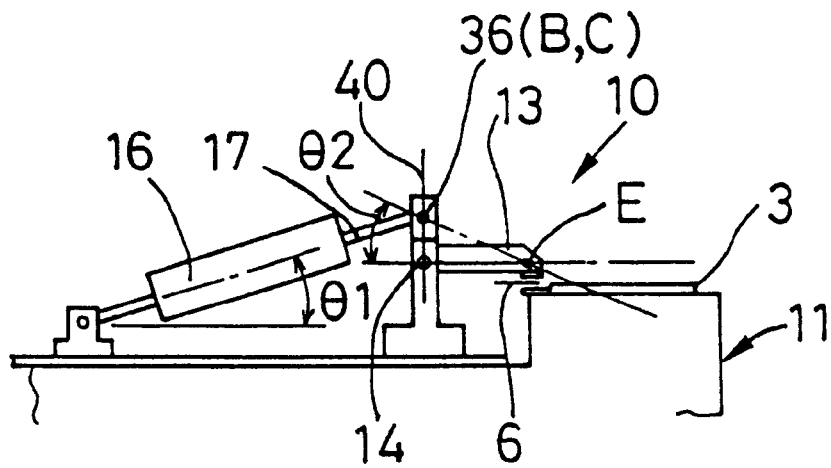
FIG. 12(a) is a front view showing the apparatus of the present invention.
Figure 12B:
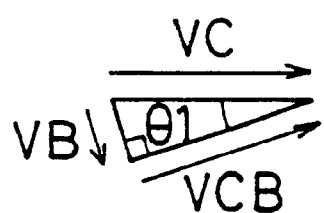
FIGS. 12(b) and 12(c) are vector diagrams showing a velocity of each part of the apparatus of the present invention.
Figure 12C:
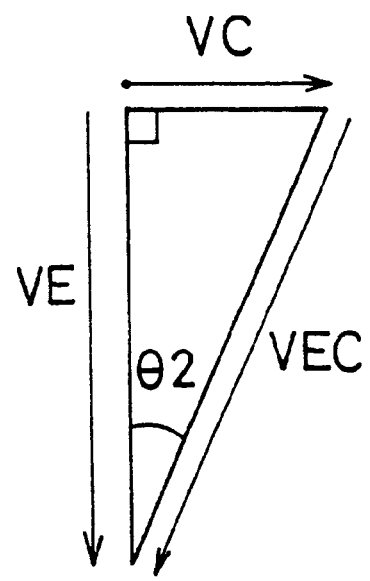

With reference to FIG. 12(a), the effects of the apparatus in which the direction of force to be applied by a cylinder is at a certain angle to a line 40 will be described below. When a piston rod 17 is slid at a constant velocity of VCB by the cylinder 16, a point C on the point 36 where force is applied is moved at a constant velocity of VCB relative to a point B. In FIG. 12(a), the point B is a point, which corresponds to a point C when the cylinder is extended to the point C. Since the direction and the level of VCB and the direction of rotation of the point B are determined, an absolute velocity VC of the point C is determined as shown in FIG. 12(b). In addition, since the direction of movement of a point E is determined, an absolute velocity VE of the point E is determined as shown in FIG. 12(c).

Figure 13A:
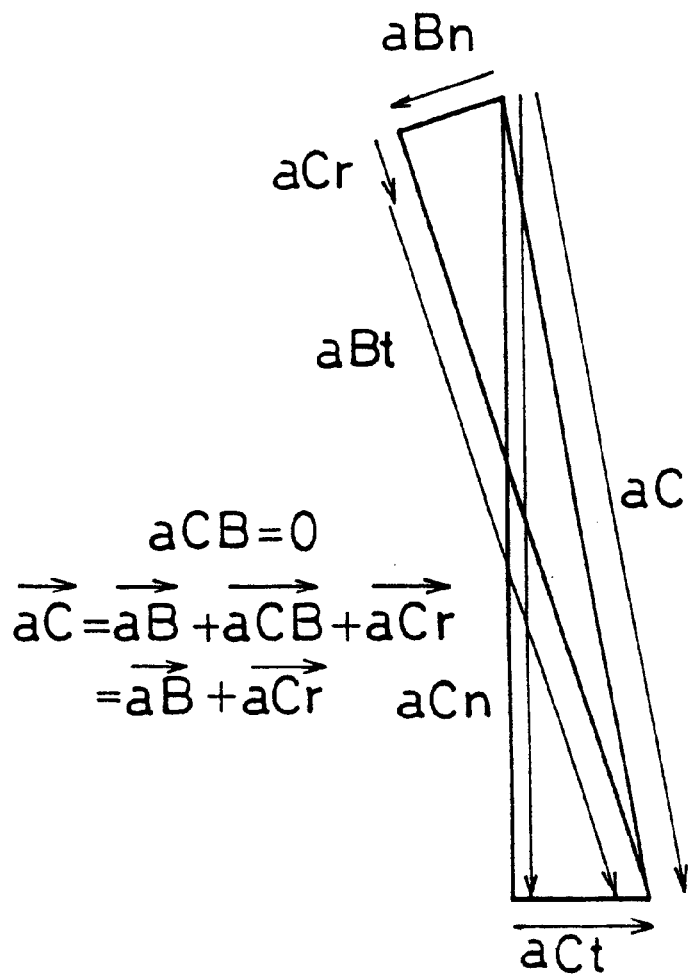
FIGS. 13(a) and 13(b) are vector diagrams showing a velocity of each part of the apparatus of the present invention.
Figure 13B:
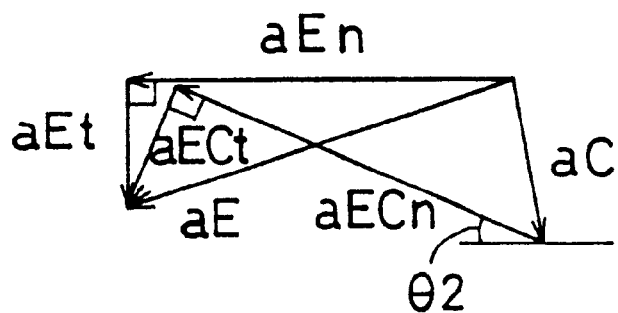

When force is applied at a certain angle to the line 40, an absolute acceleration aE of the point E is determined as shown in FIG. 13(b) by obtaining an absolute acceleration aC of the point C as shown in FIG. 13(a). In FIG. 13(b), aEn is an radial acceleration, aEt is a tangential acceleration, and acr is a Coriolis' acceleration.

Figure 14A:
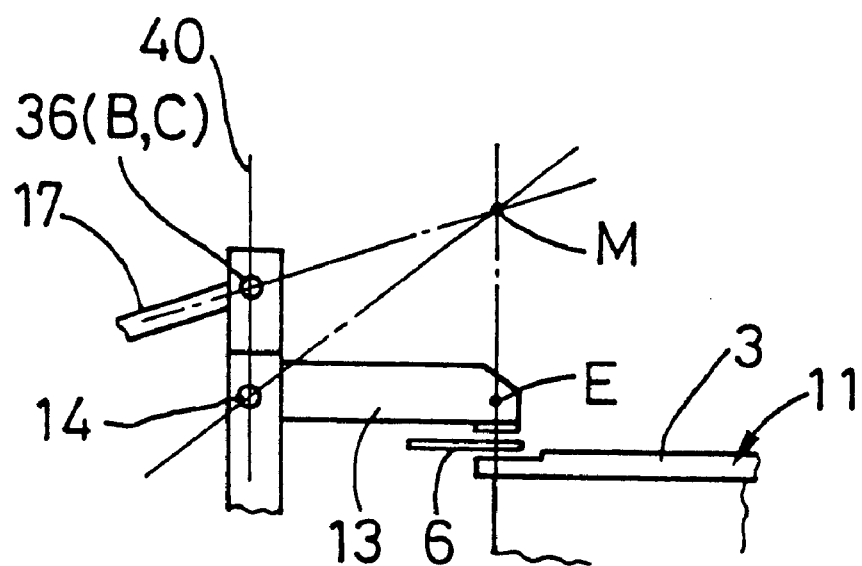
FIG. 14(a) is a partial front view showing the apparatus of the present invention.
Figure 14B:
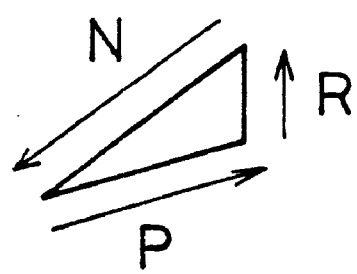
FIG. 14(b) is a vector diagram showing that the total sum of vectors is 0.

A reaction force R applied to the point E by a base 11 and an inspection substrate 3, that is, a pressing force applied to the inspection substrate 3 by the point E, is determined as shown in FIG. 14(b). A line of action of the pressure P, a line of action of the reaction force N and a line of action of the reaction force R of the point E intersect at a point M as shown in FIG. 14(a). In this embodiment, since the direction of pressure P applied to the point C and the direction of pressure R applied to the point E are determined, the direction of N is determined. Thus, by determining the direction of N, R is obtained as shown in FIG. 14(b) because the total sum of vectors P, R, and N is 0.

Figure 15A:
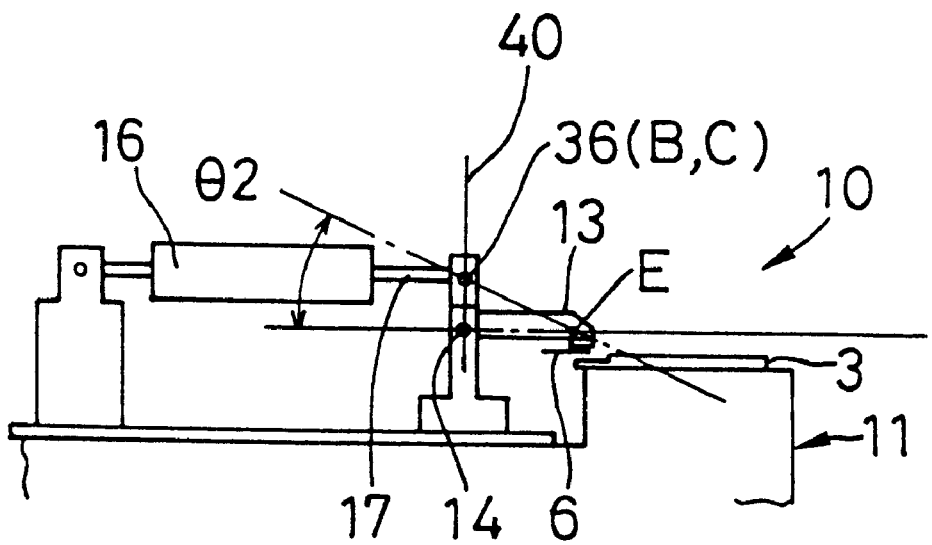
FIG. 15(a) is a partial front view showing the apparatus of the present invention.
Figure 15B:
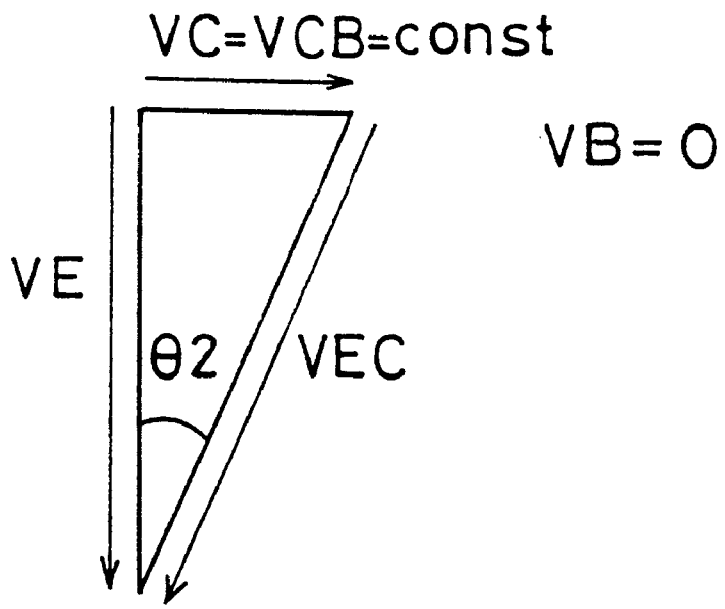
FIG. 15(b) is a vector diagram showing a velocity vector of each part of the apparatus according to the present invention.
Figure 16A:
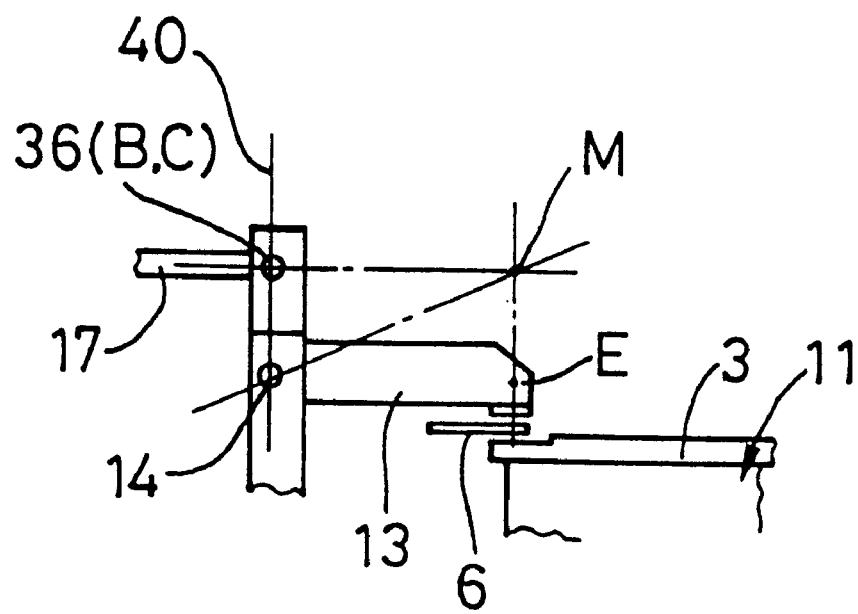
FIG. 16(a) is a partial front view showing the apparatus of the present invention.
Figure 16B:
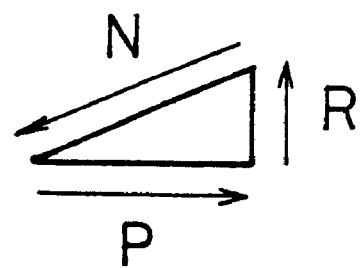
FIG. 16(b) is a vector diagram showing that the total sum of force vectors is 0.
Figure 17A:
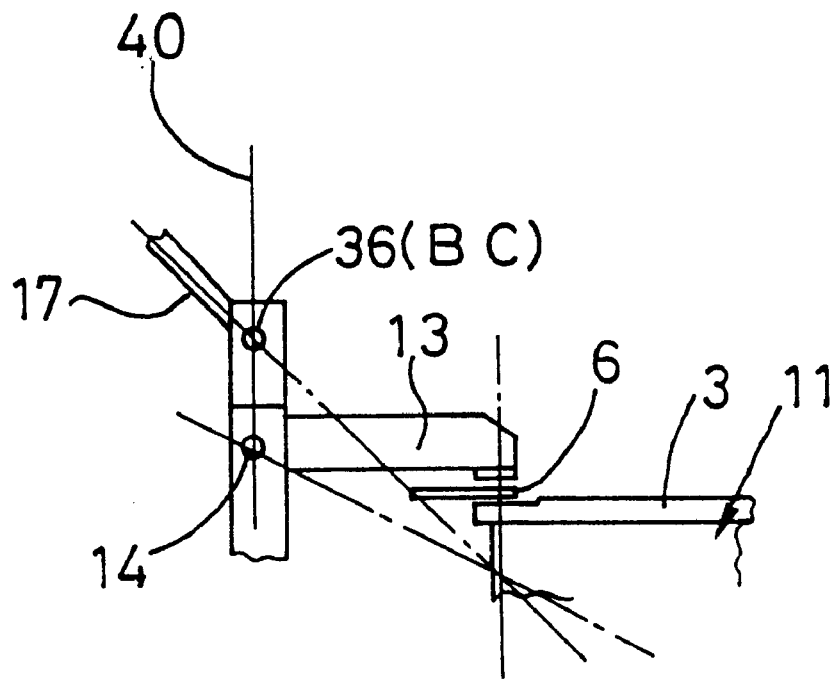
FIG. 17(a) is a partial front view showing the apparatus of the present invention.
Figure 17B:
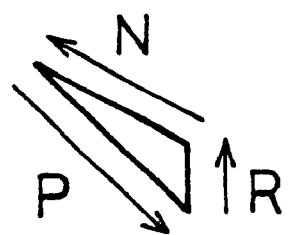
FIG. 17(b) is a vector diagram showing that the total sum of force vectors is 0.

Next, the effects of the apparatus in which the direction of force to be applied to the other end of a split pressure head by a cylinder 16 is perpendicular to a line 40 as shown in FIG. 15(a) will be described below. In this case, since an absolute velocity VC of the point C is constant, an absolute velocity VE of the point E is constant as well, as shown in FIG. 15(b). For this reason, a tangential acceleration aCt of the point C and a tangential acceleration aEt of the point E are not produced. The force R applied to the point E is determined by creating a drawing as shown in FIG. 16. When the direction of force applied to the end of the split pressure a head by a cylinder 16 is at an accurate angle to the line 40, the reaction force R of the point E is determined as shown in FIG. 17(b).

Since the direction of force applied to the end of a split pressure head by a cylinder 16 is perpendicular to the line 40 in the apparatuses shown in FIGS. 10 and 11, an absolute velocity VE of the point E and a reaction force R of the point E can be obtained in the same manner as shown in FIGS. 15 and 16.

Referring now to FIGS. 12(a) and 15(a), the absolute velocities VE of the point E are compared. When the direction of force applied to the end of a split pressure head by the cylinder 16 is perpendicular to the line 40 as shown in FIG. 12(a), a tangential acceleration aEt of the point E are not produced and the absolute velocity VE is low, so that it is easier to estimate a pivoting speed of the split pressure heads 13 in the apparatus shown in FIG. 12(a) than in the one shown in FIG. 15(a) in which the direction of pressure applied to the end of a split pressure head by a cylinder 16 is at a certain angle to the line 40. For this reason, the prober plate 6 can be easily and securely pressed by the split pressure heads 13 in the apparatus shown in FIG. 12(a).

Next, referring to FIGS. 14(a) and (b), 16(a) and (b), and 17(a) and (b), reaction forces R are compared. In the apparatus shown in FIG. 16(a) in which the direction of force applied to the end of a split pressure head by a cylinder 16 is perpendicular to the line 40, a higher reaction force R is produced than in the apparatus shown in FIG. 17(a) in which the direction of force applied to the end of a split pressure head by a cylinder 16 is at a certain angle to the line 40, so that the split pressure heads 13 can press the prober plate 6 harder on the inspection substrate 3. Therefore, an intimate contact between the prober plate 6 and electrode-forming portion of the inspection substrate can be ensured. On the other hand, if it is necessary to reduce a pressing force applied to the prober plate 6 and the inspection substrate 3 by the heads 13 so as to avoid damage to the inspection substrate 3, it is preferable that the direction of force applied to the end of a split pressure head by a cylinder 16 is at a certain angle to the line 40. It is clear from the drawings that the reaction force R is the highest when the direction of force is perpendicular to the line 40, because a difference between the slops of the line N and the line P shown in FIGS. 14(b), 16(b) and 17(b) is narrowed and the reaction force R becomes closer to zero as an absolute value of θ1 increases.

Figure 18:
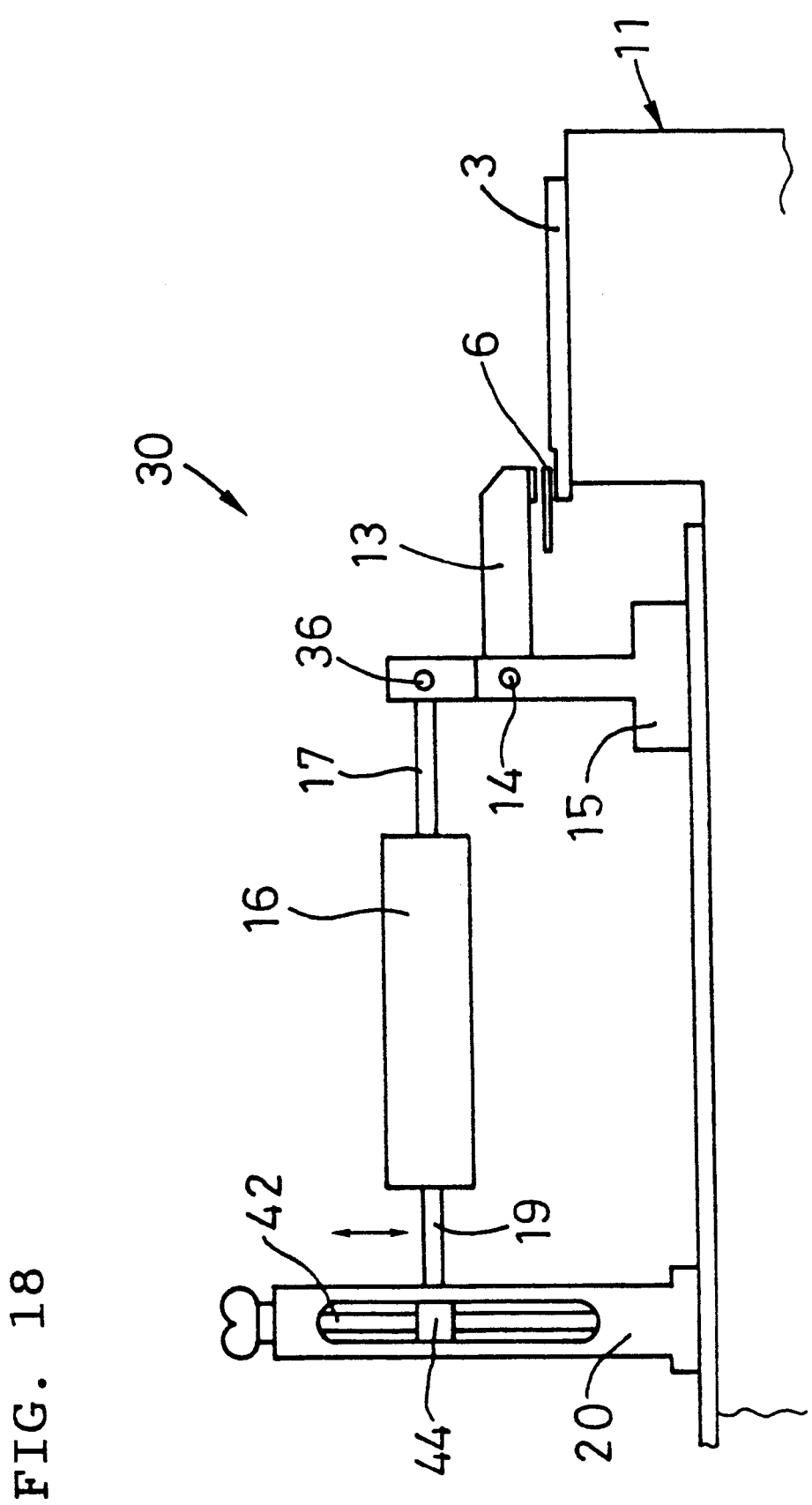
FIG. 18 is a front sectional view showing another embodiment of the apparatus of the present invention.

In the apparatus 10 of the present invention, the direction of force applied by the cylinder 16 can be adjusted as shown in FIG. 18. In the apparatus 10 shown in FIG. 18, a sliding member 44 can be slid by rotating a screw 42 and thereby the arm 19 of the cylinder 16 can be moved up an down to adjust the angle of the piston rod 17. In this apparatus 10, since the direction of force applied to the end of a split pressure head by a cylinder 16 is adjusted, the pressure applied to the prober plate 6 and the inspection substrate 3 by the split pressure heads 13 can be adjusted. Therefore, the pressure can be adjusted with consideration of strengths of the prober plate 6 and the inspection substrate 3, and moreover damage to the prober plate 6 and the inspection substrate 3 can be prevented. In addition, an intimate contact between the prober plate 6 and the inspection substrate 3 can be ensured by adjusting pressures of a plurality of split pressure heads 13 separately.

Figure 19:
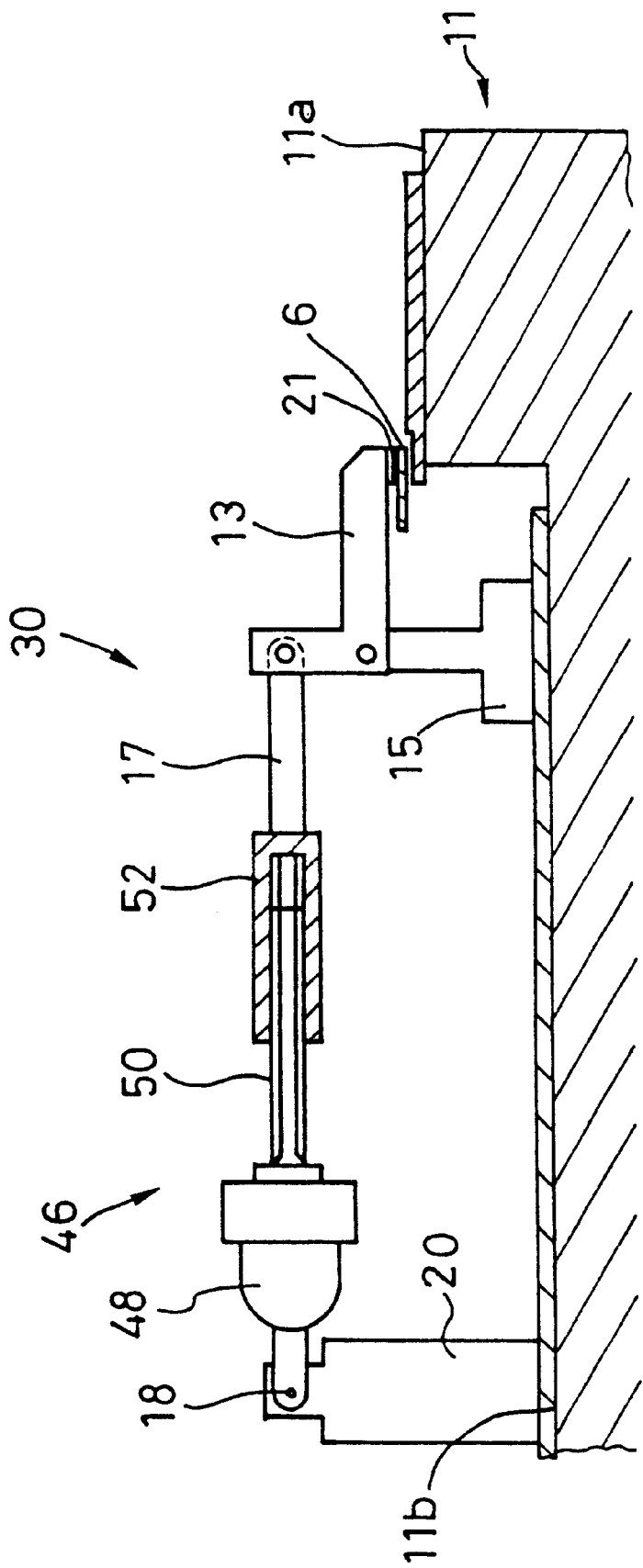
FIG. 19 is a front sectional view showing still another embodiment of the apparatus of the present invention.

In the apparatus 10 of the present invention, a driver for applying force to the end of a split pressure head 13 is not limited to the cylinder 16, but it may be a motor device 46 as shown in FIG. 19. The motor device 46 comprises: a motor 48; a male screw 50 which can be rotated by the motor 48; and a female screw 52 screwed to the male screw 50. In this motor device 46, the female screw 52 is moved in substantially horizontal direction by driving the motor 48 and thereby the piston rod 17 can apply force to the end of the split pressure heads 13.

Figure 20:
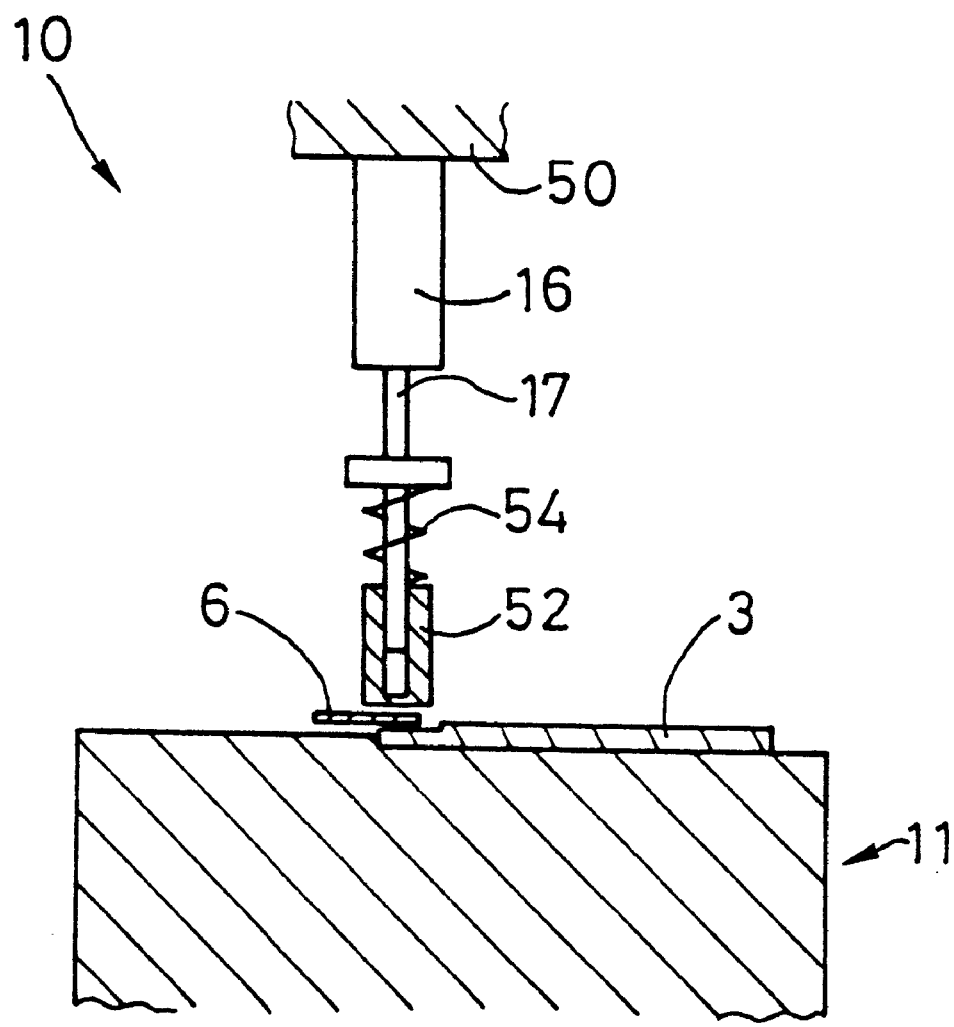
FIG. 20 is a front sectional view showing a further embodiment of the apparatus of the present invention.

Alternatively, in the apparatus 10 of the present invention, the cylinder 16 may be fixed to a securing member 50 which is integral with the base 11, and a split pressure head 52 presses the prober plate 6 by moving up and down the piston rod 17 as shown in FIG. 20. In this arrangement, the lateral dimensions of the apparatus 10 can be reduced. The split pressure head 52 is connected to the piston rod 17 and can be slid by a spring 54. Therefore it can flexibly press the prober plate 6.

Embodiments of the present invention has thus been described with reference to the accompanying drawings, however, the apparatus and the method for pressing a prober according to the present invention is not limited by the above embodiments but can be materialized in the other embodiments.

For example, an inspection substrate to be inspected by using the apparatus of the present invention is not limited to a liquid crystal panel, circuit substrate, battery substrate and the like. In addition, a prober to be used in the apparatus of the present invention is not limited to a prober plate. Furthermore, a material, shape, and dimension of a split pressure head is not particularly limited, but it may be variously designed in accordance with the shapes and the dimensions of the inspection substrate and the prober plate.

The present invention is intended to embrace various improvements, modifications, and alternations made on the basis of knowledge of those skilled in the art without departing from the scope of the invention.

As described above, in the apparatus and the method for pressing a prober according to the present invention, a long flexible prober plate can be pressed by sufficient contact pressure without injury to the prober plate. Therefore, reliability of the contact between the prober plate and the electrodes can be improved, so that the prober plate can be used for various purposes. Furthermore, compared to a conventional probe needle, the cost of inspection can be considerably reduced.

According to the apparatus and method for pressing a prober of the present invention, split pressure heads each have a pressing surface at its one end, and a prober plate is pressed on an electrode-forming portion of an inspection substrate by the pressing surfaces. Since a plurality of split pressure heads each have a pressing surface of a uniform size, predetermined portions of the prober plate can be pressed on the inspection substrate by a plurality of pressing surfaces.

Further, according to the apparatus and method for pressing a prober of the present invention, a plurality of split pressure heads press the prober plate separately. Therefore, even if the prober plate or the inspection substrate varies in thickness according to parts to be pressed, each of the split pressure heads can press a suitable part of the prober plate separately by appropriate pressure. Thus, the apparatus and method of the present invention can be adapted to various kinds of prober plates and inspection substrates and the versatility thereof can be increased.

Furthermore, according to the apparatus and method for pressing a prober of the present invention, a plurality of split pressure heads are pivoted by a driver, and a predetermined portion of the prober can be pressed by the pressing surface of the split pressure heads. Accordingly, the prober plate can be brought into intimate contact with the electrode-forming portions of the inspection substrate by high pressure, and the pressure of each head is separately adjustable.

Further, according to the apparatus and method for pressing a prober of the present invention, middle parts of the split pressure heads are secured to a base by pin-coupling portions so that pressure is applied to the other ends of the split pressure heads by the driver and pressing surfaces of the split pressure heads at one end can press predetermined parts of the prober plate. Therefore, the split pressure heads can be stably pivoted by the driver, and reliability and reproducibility of the contact between the prober and the electrode-forming portion of the inspection substrate can be improved.

Further, according to the apparatus and method for pressing a prober of the present invention, force is applied to the other end of the split pressure heads by the driver from a predetermined direction. For example, where the direction of force is substantially perpendicular to a line including the pin-coupling portions and the points where the force is applied, the pressing surfaces of the split pressure heads can press the prober plate by higher pressure at a lower speed. On the other hand, where the direction of force is at certain angles to the line including the pin-coupling portions and the points where the force is applied, the pressing surfaces of the split pressure heads can press the prober plate by lower pressure at a higher speed.

The embodiments of the present invention has thus been described with reference to the drawings. Many changes, modifications, and improvements of the subject invention will, however, become apparent to those skilled in the art after considering this specification and accompanying drawings which disclose the preferred embodiments thereof. All such changes, modifications and improvements which do not depart form the spirit and scope of the invention are deemed to be covered by the invention, which is to be limited only by the claims which follow.

What is claimed is:

1. An apparatus for pressing a prober, comprising:
   a prober plate having two surfaces, a first surface having an electrode-forming portion for having a surface contact with an electrode-forming portion of an inspection substrate, and a second surface having no electrode-forming portion and being opposite to the first surface; and
   a press for pressing the electrode-forming portion of the prober plate on the electrode-forming portion of the inspection substrate,
   wherein said press has a plurality of split pressure heads and said plurality of split pressure heads press the electrode-forming portion of the prober plate independently.

2. The apparatus for pressing a prober according to claim 1, wherein said prober plate is a flexible insulated substrate with electrodes formed thereover.

3. The apparatus for pressing a prober according to claim 2, wherein said flexible insulated substrate is a resin film.

4. The apparatus for pressing a prober according to claim 1, wherein said press has a driver for driving the plurality of split pressure heads.

5. The apparatus for pressing a prober according to claim 4, wherein said plurality of split pressure heads press the electrode-forming portion of the prober plate separately.

6. The apparatus for pressing a prober according to claim 4, wherein the pressing surface of each of said split pressure heads is caused to press the second surface of the prober plate by pivoting of said split pressure heads by means of said driver.

7. The apparatus for pressing a prober according to claim 6 wherein the pressing surface of each of said split pressure heads has a cushioning material.

8. The apparatus for pressing a prober according to claim 1, wherein said plurality of split pressure heads each have a pressing surface for pressing the second surface of the prober plate.

9. An apparatus for pressing a prober, comprising:
   a prober plate having two surfaces, a first surface having an electrode-forming portion for having a surface contact with an electrode-forming portion of an inspection substrate, and a second surface having no electrode-forming portion and being opposite to the first surface;
   a press for pressing the electrode-forming portion of the prober plate on the electrode-forming portion of the inspection substrate, and a base for placing the inspection substrate thereon, wherein said press has a plurality of split pressure heads, and wherein said plurality of split pressure heads each have a pressing surface at one end thereof for pressing the electrode-forming portion of the prober plate, a point in the vicinity of the other end of the split pressure heads where force is applied by a driver, and a pin-coupling portion for securing a middle portion of said split pressure heads to said base.

10. The apparatus for pressing a prober according to claim 9, wherein the direction of said force applied to said point in the vicinity of the other end of the split pressure heads is substantially perpendicular to a line passing through said point in the vicinity of the other end of the split pressure heads and the pin-coupling portion of each of said split pressure heads.

11. The apparatus for pressing a prober according to claim 9, wherein the direction of said force applied to said point in the vicinity of the other end of the split pressure heads is at certain angles to the line including the pin-coupling portion and the point.

12. The apparatus for pressing a prober according to claim 9, wherein said press has a driver for driving the plurality of split pressure heads.

13. The apparatus for pressing a prober according to claim 12, wherein said pressing surface of each of the split pressure heads is caused to press the second surface of the prober plate by pivoting said split pressure head by means of said driver.

14. The apparatus for pressing a prober according to claim 9, wherein said plurality of split pressure heads each have a pressing surface for pressing second surface of the prober plate.

15. The apparatus for pressing a prober according to claim 14, wherein said pressing surface has a cushioning material.

16. The apparatus for pressing a prober according to claim 9, wherein said prober plate is a flexible insulated substrate with electrodes formed thereover.

17. The apparatus for pressing a prober according to claim 16, wherein said flexible insulating substrate is a resin film.

* * * * *